US011161329B2

(12) United States Patent
Lima et al.

(10) Patent No.: US 11,161,329 B2
(45) Date of Patent: Nov. 2, 2021

(54) MULTILAYER COMPOSITES COMPRISING HEAT SHRINKABLE POLYMERS AND NANOFIBER SHEETS

(71) Applicant: Lintec of America, Inc., Richardson, TX (US)

(72) Inventors: Marcio D. Lima, Richardson, TX (US); Julia Bykova, Richardson, TX (US)

(73) Assignee: LINTEC OF AMERICA, INC., Richardson, TX (US)

(*) Notice: Subject to any disclaimer, the term of this patent is extended or adjusted under 35 U.S.C. 154(b) by 0 days.

(21) Appl. No.: 15/950,284

(22) Filed: Apr. 11, 2018

(65) Prior Publication Data

US 2018/0297340 A1  Oct. 18, 2018

Related U.S. Application Data

(60) Provisional application No. 62/484,596, filed on Apr. 12, 2017.

(51) Int. Cl.
*B32B 27/12* (2006.01)
*B32B 5/26* (2006.01)
(Continued)

(52) U.S. Cl.
CPC ............ *B32B 27/12* (2013.01); *B29C 61/025* (2013.01); *B29C 63/06* (2013.01); *B29C 63/40* (2013.01);
(Continued)

(58) Field of Classification Search
CPC .. B32B 27/12; B32B 5/26; B32B 1/08; B32B 27/304; B32B 27/08; B32B 27/32; B32B 2255/20; B32B 2255/10; B32B 2255/205; B32B 2307/736; C23C 14/18; C23C 14/30; B29C 63/40; B29C 63/06; B29C 61/025; Y10T 428/24132; Y10T 428/24; Y10T 428/24124; Y10T 428/24058;
(Continued)

(56) References Cited

U.S. PATENT DOCUMENTS

| 4,532,189 A * | 7/1985 | Mueller | ............... B32B 27/32 |
| | | | 264/171.28 |
| 2005/0142313 A1* | 6/2005 | Grah | ............... C08J 3/28 |
| | | | 428/35.7 |

(Continued)

FOREIGN PATENT DOCUMENTS

| CN | 103144356 | 6/2013 |
| CN | 103144356 A * | 6/2013 |

(Continued)

OTHER PUBLICATIONS

[NPL-1] Polymer Science Learning Center; "Why does Shrink Wrap Plastic shrink?"; (source date of: Jun. 2, 2002), <https://pslc.ws/macrog/work/shrink.htm>. (Year: 2002).*

(Continued)

*Primary Examiner* — Frank J Vineis
*Assistant Examiner* — Donald M Flores, Jr.
(74) *Attorney, Agent, or Firm* — Greenblum & Bernstein, P.L.C.

(57) ABSTRACT

A multilayer composite is disclosed comprising a heat shrinkable polymer layer and a nanofiber layer. Methods of forming the composite and uses thereof are also described.

14 Claims, 5 Drawing Sheets

(51) Int. Cl.
  B32B 27/32    (2006.01)
  B29C 61/02    (2006.01)
  B32B 27/08    (2006.01)
  B32B 27/30    (2006.01)
  B32B 1/08     (2006.01)
  B29C 63/06    (2006.01)
  B29C 63/40    (2006.01)
  C23C 14/30    (2006.01)
  C23C 14/18    (2006.01)
  B29L 23/00    (2006.01)
  B29K 27/06    (2006.01)
  B29K 627/06   (2006.01)
  B29L 9/00     (2006.01)

(52) U.S. Cl.
  CPC .......... *B32B 1/08* (2013.01); *B32B 5/26* (2013.01); *B32B 27/08* (2013.01); *B32B 27/304* (2013.01); *B32B 27/32* (2013.01); *C23C 14/18* (2013.01); *C23C 14/30* (2013.01); *B29K 2027/06* (2013.01); *B29K 2627/06* (2013.01); *B29L 2009/008* (2013.01); *B29L 2023/22* (2013.01); *B32B 2255/10* (2013.01); *B32B 2255/20* (2013.01); *B32B 2255/205* (2013.01); *B32B 2307/736* (2013.01); *Y10T 428/1328* (2015.01); *Y10T 428/24* (2015.01); *Y10T 428/24058* (2015.01); *Y10T 428/24124* (2015.01); *Y10T 428/24132* (2015.01)

(58) Field of Classification Search
  CPC ......... Y10T 428/1328; B29L 2009/008; B29L 2023/22; B29K 2627/06; B29K 2027/06
  See application file for complete search history.

(56) References Cited

U.S. PATENT DOCUMENTS

| | | | | |
|---|---|---|---|---|
| 2008/0063860 A1* | 3/2008 | Song | .................. | B32B 27/08 428/336 |
| 2008/0193767 A1* | 8/2008 | Lee | .................. | B32B 5/16 428/408 |
| 2009/0181239 A1* | 7/2009 | Fan | .................. | B29C 43/003 428/327 |
| 2011/0111177 A1* | 5/2011 | Hata | .................. | B82Y 40/00 428/161 |
| 2012/0171411 A1* | 7/2012 | Lashmore | .................. | B32B 5/022 428/114 |
| 2012/0251432 A1* | 10/2012 | Cooper | .................. | B01J 37/0215 423/447.3 |
| 2017/0086709 A1* | 3/2017 | Khine | .................. | A61B 5/6833 |

FOREIGN PATENT DOCUMENTS

| | | | |
|---|---|---|---|
| JP | 2016-503563 | 2/2016 | |
| WO | 2015/179320 | 11/2015 | |
| WO | 2017/048847 | 3/2017 | |
| WO | WO-2017048847 A1 * | 3/2017 | ............... B32B 5/02 |

OTHER PUBLICATIONS

[NPL-2] He et al. (CN 103144356 A), Jun. 2013 (EPO—machine translation to English). (Year: 2013).*

"Shrink Wrap", Sep. 5, 2016, [Retrieved from the Internet:URL: https://en.wikipedia.org/w/index.php?Title=Shrink_wrap&oldid=737874328, [copy retrieved on Jun. 7, 2018], Wikipedia.

Zhang et al., "Assembly of Carbon Nanotube Sheets" In Tech, Electronic Properties of Carbon Nanotubes, Chapter 1 Published: Jul. 27, 2011 (doi: 10.5772/17352), 19 pages.

International Search Report and Written Opinion received for Patent Application No. PCT/US2018/027033, dated Jul. 3, 2018, 15 pages.

Office Action dated Jun. 22, 2021, issued in Japanese patent application No. 2019-555764 along with corresponding English translation.

Japanese Office Action dated Oct. 27, 2020 issued in Japanese patent application No. 2019-555764 and corresponding English translation.

* cited by examiner

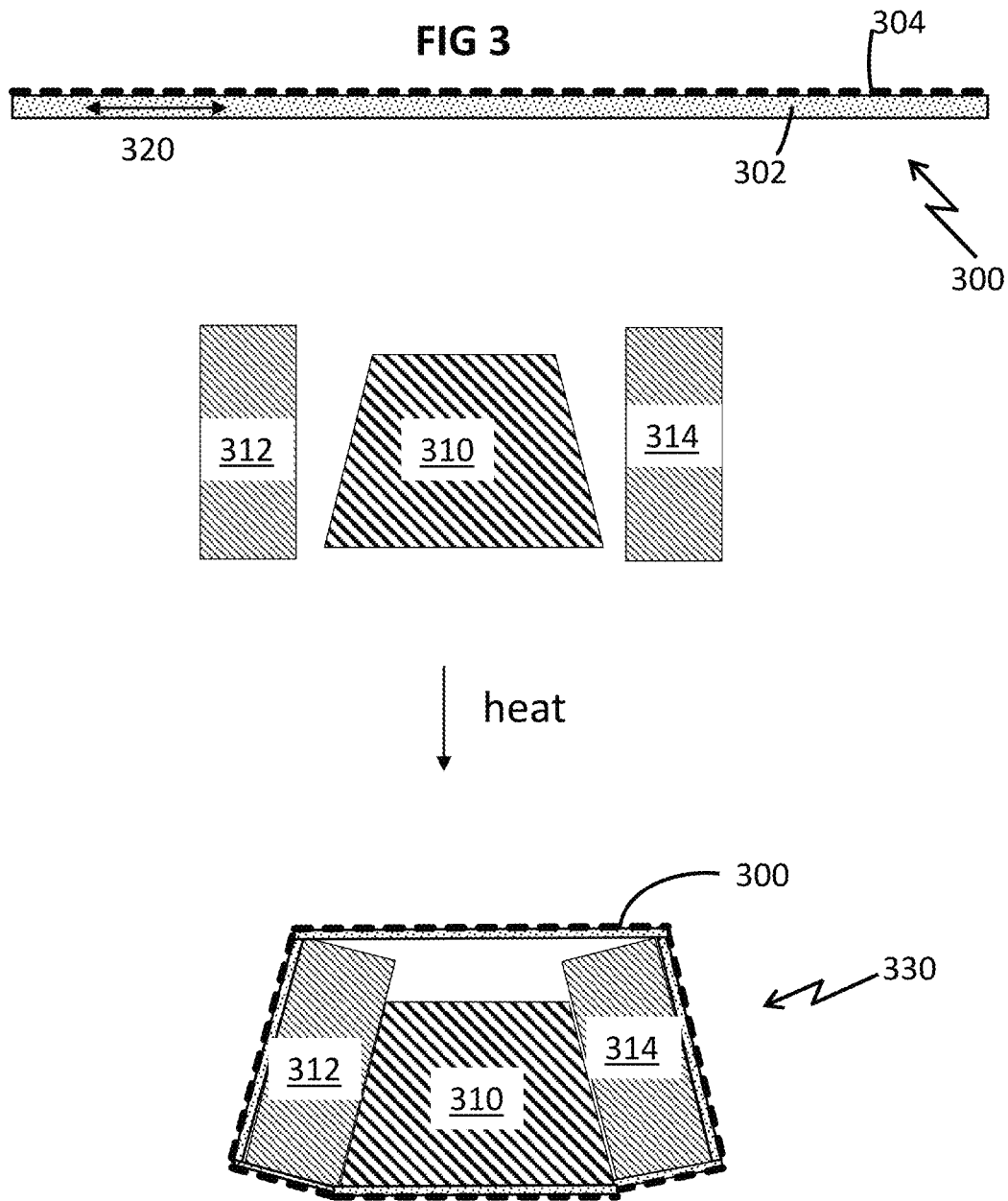

↓ heat

MULTILAYER COMPOSITES COMPRISING HEAT SHRINKABLE POLYMERS AND NANOFIBER SHEETS

RELATED APPLICATIONS

This application claims priority to U.S. Provisional Patent Application No. 62/484,596, filed on Apr. 12, 2017, which is incorporated by reference herein in its entirety.

TECHNICAL FIELD

The present disclosure relates to multilayer composites comprising nanofiber sheets and heat shrinkable polymers.

BACKGROUND

Heat shrinkable materials are thermally sensitive compounds that are useful in many applications, including for providing a protective layer on or around an object. Their principal advantage is that they can be applied loosely over the object and later formed to the desired shape by the application of heat, which causes the heat shrinkable material to contract forming a tight fit on or around the desired surface. After cooling, the heat shrinkable material will retain its received shape around the object.

SUMMARY

Example 1 is a multilayer composite that includes at least one heat shrinkable polymer layer and at least one carbon nanofiber sheet layer, wherein the heat shrinkable polymer layer:

Example 2 includes the subject matter of Example 1, wherein the heat shrinkable polymer layer has a surface in contact with a surface of the carbon nanofiber sheet layer.

Example 3 includes the subject matter of either Example 1 or Example 2, wherein the carbon nanofiber sheet layer is embedded in the heat shrinkable polymer layer.

Example 4 includes the subject matter of any of the preceding Examples, wherein the heat shrinkable polymer layer has at least one orientation direction and wherein at least one dimension of the multilayer composite can be reduced along the orientation direction with heat.

Example 5 includes the subject matter of Example 4, wherein the heat shrinkable polymer layer has a primary orientation direction and/or the carbon nanofiber sheet has a primary orientation direction.

Example 6 includes the subject matter of Example 4, wherein the multilayer composite is tubular and can be reduced in length, thickness, circumference, or combinations thereof.

Example 7 includes the subject matter of any of the preceding Examples, wherein the carbon nanofiber sheet layer comprises at least one carbon nanofiber sheet, the carbon nanofiber sheet comprising an arrangement of nanofibers aligned end to end in a plane.

Example 8 includes the subject matter of Example 7, wherein an average nanofiber diameter of the carbon nanofiber sheet is less than about 30 nm.

Example 9 includes the subject matter of any of the preceding Examples, wherein the carbon nanofiber sheet comprises a plurality of carbon nanotubes selected from one or more of single wall carbon nanotubes, double walled carbon nanotubes and triple walled carbon nanotubes.

Example 10 includes the subject matter of any of the preceding Examples, wherein the carbon nanofiber sheet layer comprises a first carbon nanofiber sheet having a fiber alignment different from an adjacent second carbon nanofiber sheet.

Example 11 includes the subject matter of any of the preceding Examples, wherein the carbon nanofiber sheet layer comprises at least one densified carbon nanofiber sheet.

Example 12 includes the subject matter of any of the preceding Examples, wherein the carbon nanofiber sheet layer further comprises at least one polymer.

Example 13 includes the subject matter of Example 12, wherein the polymer infiltrates the carbon nanofiber sheet.

Example 14 includes the subject matter of any of the preceding Examples, comprising a metal layer on at least one surface of the carbon nanofiber sheet.

Example 15 includes the subject matter of any of the preceding Examples, wherein the carbon nanofiber sheet layer comprises an additive selected from the group consisting of: metal particles, metal coating, metal nanoparticles, metal flakes, metal wires, metal nanowires, ceramic particles, ceramic nanoparticles, ceramic flakes, ceramic wires, ceramic nanowires, pigments, and mixtures thereof.

Example 16 includes the subject matter of Example 15, wherein the additive is magnesium diboride, titanium dioxide, or lithium phosphate.

Example 17 includes the subject matter of any of the preceding Examples, wherein the at least one carbon nanofiber sheet layer comprises a carbon nanofiber sheet and at least one graphene layer on the carbon nanofiber sheet.

Example 18 is a method of forming a multilayer composite that includes forming a multilayer composite comprising combining at least one heat shrinkable polymer layer and at least one carbon nanofiber sheet layer, wherein the heat shrinkable polymer layer has a surface in contact with a surface of the carbon nanofiber sheet layer; and is configured to reduce in size by at least 10% in at least one dimension in response to application of heat to the heat shrinkable polymer.

Example 19 includes the subject matter of Example 18, wherein the carbon nanofiber sheet layer is overlaid on the heat shrinkable polymer layer.

Example 20 includes the subject matter of Examples 18 or 19, wherein the carbon nanofiber sheet layer comprises at least one carbon nanofiber sheet, the carbon nanofiber sheet comprising an arrangement of carbon nanofibers aligned end to end in a plane, and wherein the carbon nanofiber sheet is prepared by a method comprising: i) producing a carbon nanofiber forest comprising carbon nanofibers, the carbon nanofiber forest having a sidewall; ii) connecting an attachment to the sidewall or near the sidewall of the carbon nanofiber forest; and iii) drawing the carbon nanofiber sheet from the carbon nanofiber forest by drawing upon the attachment.

Example 21 includes the subject matter of Example 20, further comprising densifying the nanofiber sheet by: i) infiltrating the carbon nanofiber sheet with a liquid to form an infiltrated carbon nanofiber sheet; and ii) evaporating the liquid from the infiltrated carbon nanofiber sheet to form a densified carbon nanofiber sheet, wherein the carbon densified nanofiber sheet has a density that is at least 100% higher than the nanofiber sheet.

Example 22 includes the subject matter of Example 21 further comprising applying a polymer to the carbon nanofiber sheet layer, the applying comprising: i) infiltrating the carbon nanofiber sheet with a liquid comprising a polymer to form a polymer infiltrated carbon nanofiber sheet; and ii)

evaporating the liquid from the polymer infiltrated carbon nanofiber sheet to form the carbon nanofiber sheet layer.

Example 23 includes the subject matter of Example 20, further comprising applying a metal layer and a polymer to the carbon nanofiber sheet layer, the applying comprising: i) depositing a metal layer onto at least a portion of the carbon nanofiber sheet; ii) infiltrating the carbon nanofiber sheet with a liquid comprising a polymer to form a polymer infiltrated carbon nanofiber sheet; iii) overlaying the polymer infiltrated carbon nanofiber sheet onto the heat shrinkable polymer layer; and iv) evaporating the liquid from the polymer infiltrated carbon nanofiber sheet to form the nanofiber sheet layer.

Example 24 includes the subject matter any of Examples 18-23, further comprising applying at least one graphene sheet to the carbon nanofiber sheet.

BRIEF DESCRIPTION OF THE DRAWINGS

FIG. 3 illustrates an embodiment of a use of the disclosed multilayer composites.

DETAILED DESCRIPTION

General Overview

Figure 1:
FIG. 1 shows an example multilayer composite comprising a heat shrinkable polymer layer in contact with a nanofiber sheet layer, in accordance with an embodiment of the subject disclosure.

The present disclosure relates to multilayer composites and, more particularly, to multilayer composites comprising nanofiber sheets and heat shrinkable polymers.

As described above, heat shrinkable materials are thermally sensitive compounds that are useful for providing a protective or functional layer on or around objects. Two principal types of heat shrinkable materials are thermoplastic polymers and thermoset polymers. A thermoplastic simply softens and shrinks when heated and hardens when cooled, remaining chemically unchanged. For example, a thermoplastic heat shrinkable polymer may be oriented when formed, and, upon heating, the polymer softens, allowing the chains to reorient and relax. By comparison, a thermoset polymer undergoes a chemical reaction during the heating process, fundamentally changing the material. Once heated a thermoset polymer cannot be reformed with the application of heat, while a thermoplastic can be reformed.

Heat shrinkable materials are often used to protect an object, particularly an irregularly shaped object, by encasing the object when the material shrinks. In particular, electrical wiring can be enclosed in a heat shrinkable polymeric material to provide electrical insulation and protection against abrasion. Conductive heat shrinkable polymers can be used to provide EMI and ESD protection for wires or electronics and may have advantages over other materials, such as braided meshes, in their ease of applicability. In addition, when conventional EMI shielding braids are used, residual space is often left between the braids, which can serve to leak EM radiation. Using the composites described herein, a complete shielding layer can be formed around the conductor.

Heat can be applied to a thermally shrinkable polymer using an external heat source or intrinsically by applying an electric field to induce heat from within the nanofiber layer. In some cases, the application of an external heat source may be undesirable, unsafe, or not possible, such as for use in tight spaces or in workplace environments where an open flame or other external heat source is prohibited. Thus, an internal heat source may sometimes be desired to cause the polymer to shrink. One method for creating an internal heat supply is to treat a thermally shrinkable polymeric material so that it is conductive by, for example, adding conductive nanowires, fibers, flakes, particles, or polymers, and then to apply a voltage across the material to thereby resistively heat the material. Another method of creating an internal heat supply may be to embed magnetic particles into the heat shrinkable polymer, which may then be internally heated by inductive heating with a rapidly oscillating magnetic field. In addition, EM radiation, such as microwaves, can be used to heat the material. However, each of these methods requires relatively high concentrations of conductive materials, which can affect the properties of the polymer and also increases costs. Also, as the material shrinks in volume or surface area, electrical conductivity can change, which may lead to overheating. Furthermore, the use of wires or other structurally conductive components can limit the placement of electrodes to create thermal shrinkage, which can restrict the use of the material in more general applications.

In contrast, the embodiments described herein provide desirable properties such as flexibility and consistency in shrinkage that may be easy and inexpensive to prepare, may be readily handled, and may be heated intrinsically or externally while maintaining consistent conductivity during shape reduction.

Multilayer Composite

A multilayer composite is described that comprises at least one heat shrinkable polymer layer and at least one nanofiber sheet layer. Each of these layers will be discussed in more detail below. The composite may contain any number of heat shrinkable polymer layers and nanofiber sheet layers, as may be needed to provide desired or targeted properties to the final composite material, and various arrangements of these layers can be used. In one embodiment, the multilayer composite comprises a heat shrinkable polymer layer in contact with a nanofiber sheet layer. In this way, the heat shrinkable polymer layer and the nanofiber sheet layer share a common surface, the heat shrinkable polymer layer having a surface in direct contact with a surface of the nanofiber sheet layer. A specific example is shown in FIG. 1, in which multilayer composite 100 comprises nanofiber sheet layer 110 in contact with heat shrinkable polymer layer 120. In this arrangement, each layer is separate, allowing features of each to be used to full advantage in specific applications. In particular, top surface 130 of nanofiber sheet layer 110 is exposed, and can be used for contact with electrodes for joule heating of the composite.

Figure 2:
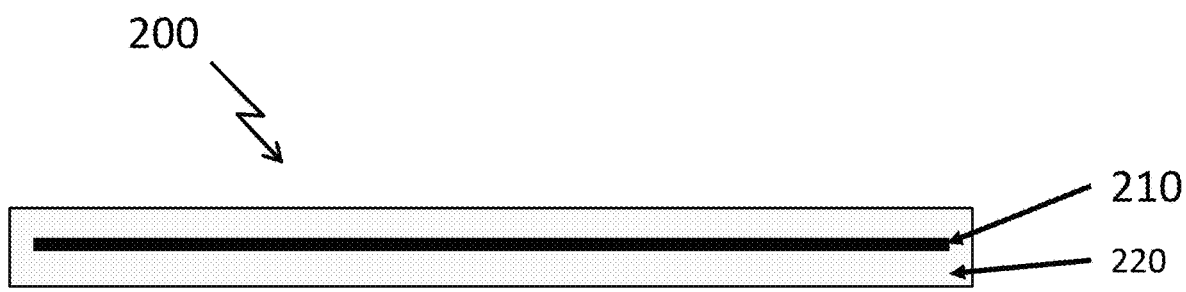
FIG. 2 shows an example embodiment of the multilayer composite comprising a nanofiber sheet layer in a heat shrinkable polymer layer.

In another embodiment, the nanofiber sheet layer is contained within the heat shrinkable polymer layer, with the nanofiber sheet layer being partially or fully encased in the heat shrinkable polymer layer. For example, the heat shrinking material layer may be formed in and around the nanofiber sheet layer. A specific example is shown in FIG. 2, in which multilayer composite 200 comprises nanofiber sheet layer 210 embedded in heat shrinkable polymer layer 220. Such an arrangement may be particularly useful for minimizing exposure of the nanofiber sheet layer, providing protection for this layer, as may be needed in some applications. In another embodiment, the heat shrinkable polymer infiltrates the interstitial space between the fibers of the nanofiber sheet layer. For example, the nanofiber sheet layer may be infiltrated by or otherwise combined with the heat shrinkable polymer layer. In such embodiments, the nanofiber sheet layer comprises the heat shrinkable polymer layer, and such an arrangement may be desirable, for example, to electrically contact the exposed nanofiber sheet layer in order to induce heat shrinkage of the heat shrinkable material layer. Various combinations of these arrangements may also be used.

Heat Shrinkable Polymer Layer

The heat shrinkable polymer layer may comprise at least one heat shrinkable polymer. When more than one polymer is present, the combination may be homogenous or may be a heterogeneous combination, such as a miscible or immiscible polymer blend or layers of heat shrinkable polymers. As used herein, the term heat shrinkable refers to the ability of a material to undergo a thermally induced physical and/or chemical change that results in an overall dimensional reduction of the material. Thus, a heat shrinkable polymer becomes reduced in size upon heating. As used herein, a material is heat shrinkable if, upon application of heat, it is reduced in size by at least 10% in at least one dimension. Such a dimensional change is not reversible without reestablishing the conditions of the polymer that resulted in its ability to shrink, and this feature distinguishes heat shrinkability from other polymer softening and shape formation processes (such as thermoforming). In some embodiments, the heat shrinkable polymer layer may have an orientation direction, which, for example, may be created upon formation of the layer (such as by extrusion or other known molding processes) and the multilayer composite may be reduced in length along this orientation direction with the application of heat.

Any suitable heat shrinkable polymer may be included in the heat shrinkable polymer layer. Typically such a material is a thermoplastic polymer, and specific examples of thermoplastic heat shrinkable polymers that can be used in the present composite material include crosslinked or non-crosslinked polymers, including polyolefins, such as polyethylene, polypropylene, fluoropolymers, including polytetrafluoroethylene (PTFE), VITON®, polyvinylidene fluoride (PVDF), fluorinated ethylene propylene (FEP), rubbers, including natural or synthetic rubbers, such as silicone rubber, and/or polyvinyl chloride (PVC). In another embodiment, the heat shrinkable polymer layer comprises a thermoset polymer, which undergoes a chemical reaction upon heating, causing the material to dimensionally shrink. Specific examples of heat shrinkable thermosets that may be used in the heat shrinkable polymer layer include but are not limited to polyurethanes, polyesters, diallyl-phthalate (DAP) and epoxies. The conditions, particularly temperature, under which the heat shrinkable polymer layer can be thermally altered, as well as the total amount of shrinkage that can occur, may depend on, for example, the type of polymer, thickness of the polymer, additive content in the polymer, water or solvent content, temperature of heat applied, duration of heat applied and the extent of orientation of the polymer. Generally, a heat shrinkable polymer can be activated by heating to a temperature close to, but below, the glass transition temperature ($T_g$) of the polymer.

In some embodiments, the heat shrinkable polymer layer may have a shrink ratio (comparing a dimension prior to heating to that resulting after heating) of at least 1.5:1, at least 2:1, or at least 3:1. The properties of the heat shrinkable polymer can also vary, depending, for example, on the needs of the specifically targeted application. For example, the polymer may be conductive or nonconductive. In one embodiment, the heat shrinkable polymer is a nonconductive polymer, and heat is applied using an external heat source. In another embodiment, the heat shrinkable polymer is conductive, and heat is applied internally, such as by applying a voltage across the material, thereby causing the material to shrink. This may be particularly useful for applications in which applying heat externally is undesirable or unsafe. The conductive heat shrinkable polymer may comprise a conductive polymer or may be a nonconductive polymer to which conductive materials (such as conductive wires, particles, fibers, or flakes) have been added in sufficient quantity to provide conductivity.

In a specific embodiment, the multilayer composite material comprises a heat shrinkable polymeric sheet, such as a square, round, or rectangular shaped sheet, that has an ingrained orientation direction resulting from its formation. The sheet may have one primary orientation direction or may be multidirectionally oriented, depending on the sheet forming process. For example, extrusion can provide unidirectional orientation (or at least having a primary orientation direction) while blow molding may provide multidirectional orientation. Upon heating, the sheet can shrink along one or all of its orientation directions, depending on the method of heating. For example, the heat shrinkable polymeric sheet may have an orientation direction that corresponds to at least one dimension of the sheet, such as its length, width, and/or thickness. The sheet may be of consistent thickness or the thickness may vary across the sheet. For instance, the sheet may be thicker in a central portion than along the edges. A specific process and example are illustrated in FIG. 3, in which multilayer composite sheet 300 is used to combine and compress multiple objects 310, 312 and 314 into a single composite 330. Composite sheet 300 has orientation direction 320 as shown. The composite sheet 300 is placed over objects 310, 312 and 314 and heat is applied using a source such as radiation, hot air, or induction. Sheet 300 may include adhesive or may be inherently tacky to assure that it can be attached securely to objects 312 and 314. Alternatively, one or more portions of composite sheet 300 can be attached using an adhesive or fastener to provide contact with the objects. In some embodiments, the composite may be self-mending so that it adheres to itself when two ends are overlapped. Pressure or heat may aid in joining the ends together. As heat is applied and composite sheet 300 shrinks in direction 320, it pulls the three individual objects 310, 312 and 314 together to form composite object 330. Additional heating can be used to apply compressive force between objects 310, 312 and 314. Note that air spaces may be retained within the shrunken composite sheet. In some cases, the composite sheet shrinks in one or more of the x, y and z dimensions, causing a reduction in overall surface area and/or thickness. In other cases, the thickness of the composite may increase as it shrinks laterally.

Figure 4A:
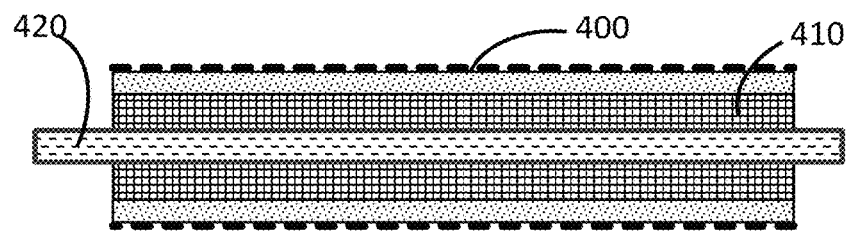
FIGS. 4A, 4B, 5A and 5B provide longitudinal and axial cross sectional drawings of an exemplary tubular nanofiber composite.
Figure 4B:
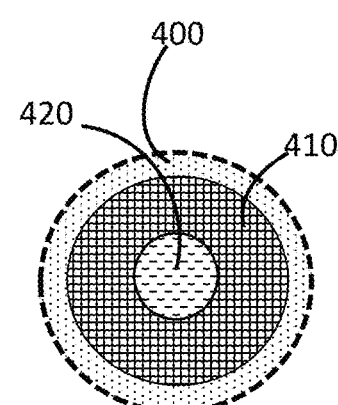
Figure 5A:
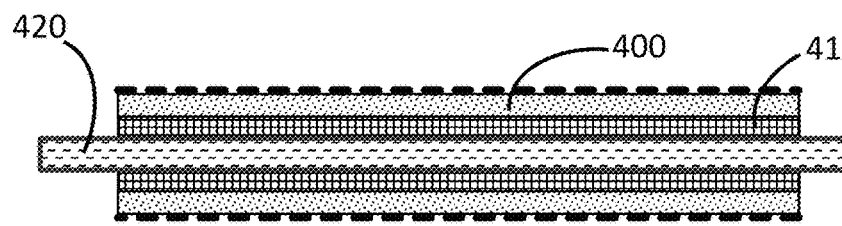
Figure 5B:
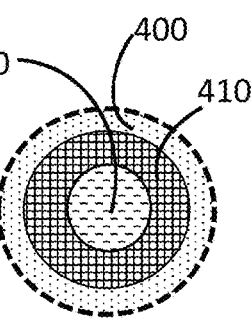

In another specific embodiment illustrated in FIGS. 4A-4B, the multilayer composite material is tubular, having a length, a thickness, and a circumference, and thermal treatment of the composite causes a reduction in any or all of these dimensions. FIG. 4A shows a longitudinal cross-sectional view of a coaxial system including multilayer carbon nanotube/polymer composite tube 400, conductor 420 and optional insulator 410. Conductor 420 may be, for example, an electrical conductor such as copper or aluminum or may be a light conductor such as glass fiber. As illustrated, a carbon nanotube sheet is on the outside of the polymer layer. As described above, the nanotubes may be on the inside of the polymer or may be embedded in the polymer and completely surrounded by polymer. Optional insulator layer 410 may be, for example, an electrical insulator such as a non-conductive polymer layer. In the embodiment shown, when heat is applied to the composite, tube 400 shrinks concentrically and compresses optional insulator layer 410 to a smaller volume around conductor 420. See FIG. 5B. Tube 400 may also be used to splice two adjoining pieces of conductor together. For instance, two conductor ends can be butted against each other and tube 400 can be shrunk around the butt joint to permanently adhere the conductor ends together.

Composite 400 can provide a flexible shield against electromagnetic interference or can be used as a conductor, for instance as a ground conductor. Composite 400 may also form half of an electrical capacitor. In some cases, the multi-layer composite functions as a conductor of heat, for example, moving heat away from conductor 420. In these cases, the multi-layer composite may contain a plurality of carbon nanotube sheets that can be in contact with each other. In another set of embodiments, the nanotubes are not in the form of a sheet but may be oriented in a direction perpendicular to the axis of conductor 420. For example, the composite may include a carbon nanotube forest that is embedded in polymer such as a heat shrinkable polymer. The axially arranged carbon nanotubes can conduct heat via phonon transfer through the nanotubes. The nanotubes may be, for example, single wall or double wall or triple wall or multi-wall carbon nanotubes. Nanotube sheets may be arranged such that the nanotubes are substantially parallel to the axis of the conductor or concentrically arranged around the axis of the conductor. In many cases, the resulting heat-shrunk multilayer composite cannot be returned to its original dimensions without first reestablishing the orientation directions of the polymeric material, which would involve reheating and reprocessing.

Nanofiber Sheet Layer

The nanofiber sheet layer of the present multilayer composite comprises at least one nanofiber sheet. As used herein, the term "nanofiber sheet" refers to an arrangement of nanofibers where the nanofibers are aligned end to end in a plane with a length and/or width that is more than 100 times greater than the thickness of the sheet. Such materials include carbon nanofibers, commercially available from Lintec of America, Inc. Any sheet comprising nanofibers or nanofibrous materials, such as carbon nanotubes, known in the art may be used, including, for example, various combinations of nanofiber-containing yarns or ribbons. As used herein, the term "nanofiber" means a fiber having a diameter less than 1 µm. Both carbon-based materials (e.g., carbon nanotubes) and non-carbon-based materials may be considered "nanofibers" for the purposes of this disclosure. These materials are described in more detail below. While the embodiments herein are primarily described as fabricated from carbon nanotubes, it will be appreciated that other carbon allotropes, whether graphene, micron or nano-scale graphite fibers and/or plates, and even other compositions of nano-scale fibers such as boron nitride may be densified using the techniques described below.

It will be appreciated that in some examples, different forms of nano-scale materials can be combined. For example, one or more sheets of graphene can be disposed over a nanofiber sheet, ribbon, strand of densified ribbon, or yarn (whether densified or not densified), thus forming a composite, carbon nanomaterial. Similarly, graphene sheets and carbon nanotube sheets can be combined to form a layered carbon nanomaterial. In some cases, multiple layers of carbon nanotube sheets and graphene sheets may be sandwiched together to form a composite sheet of multiple layers. For instance, a composite sheet may include sheets of CNT/graphene/CNT/graphene or graphene/CNT/CNT/graphene. In various embodiments, intervening sheets may completely cover adjoining sheets or may cover only a portion of an adjoining sheet. For example, spaced parallel strips of graphene sheets or carbon nanotube sheets may form a pattern on an adjoining sheet. Multiple carbon nanotube sheets in the composite may be in fibrous alignment or may be aligned at different angels, for example, at 90 degrees to another carbon nanotube sheet. Sheets may be adhered together using, for example, Van derWaals forces, an adhesive, a solvent or a polymer, such as a heat shrinkable polymer.

The nanofiber sheets may have a variety of properties that can be exploited for various applications. For example, the nanofiber sheets may have tunable opacity, high mechanical strength and flexibility, thermal and electrical conductivity, and may also exhibit hydrophobicity. Given the high degree of alignment of the nanofibers within the sheet, the nanofiber sheet may be extremely thin, rendering it nearly two-dimensional. In some examples, a nanofiber sheet is on the order of approximately 10 nm thick (as measured within normal measurement tolerances. In other examples, the thickness of a nanofiber sheet can be as high as 200 nm or 300 nm. As such, nanofiber sheets may add minimal additional thickness to a component. As such, the nanofiber sheet may only add a minimal additional area and weight to a component. The nanofiber sheet as disclosed herein may also have high purity, wherein more than 90%, more than 95% or more than 99% of the weight percent of the nanofiber sheet is attributable to nanofibers, in some instances. Similarly, the nanofiber sheet comprising carbon nanotubes may comprise more than 90%, more than 95%, more than 99% or more than 99.9% by weight of carbon. The nanofiber sheet may have a resistivity within the range of 650-1200 ohms/sq, according to some embodiments. The nanofiber sheet may also be anisotropic, exhibiting directionally dependent properties for the nanofiber sheet layer and multilayer composite. For example, in some embodiments the nanofiber sheet may exhibit anisotropy of between 50 to 70 rσ. In some embodiments, the nanofiber sheet may additionally exhibit optical transmittance of greater than 50%, greater than 65%, greater than 80%, greater than 95% or greater than 99% at a wavelength of from 400 to 700 nm.

More particularly, in some embodiments, the nanofiber sheet has a thickness of less than about 50 µm, less than 25 µm, less than 10 µm or less than 5 µm. Specific thickness ranges include, for example, between 5 nm and 20 µm, between 5 nm and 10 µm, between 5 nm and 1 µm or between 5 nm and 100 nm. The sheet may also have any length and width suitable for the intended application. In some embodiments, the nanofiber sheet has a length, width, or both that are more than 100 times greater than its thickness. For example, the nanofiber sheet may have a length of greater than one meter and a width greater than 10 cm. In some embodiments, the nanofiber sheet has an areal density of less than 10 µg/cm$^2$. Also, in some embodiments, the nanofiber sheet has a density of at least 0.002 g/cm$^3$, at least 0.005 g/cm$^3$, or at least 0.010 g/cm$^3$.

Figure 6:
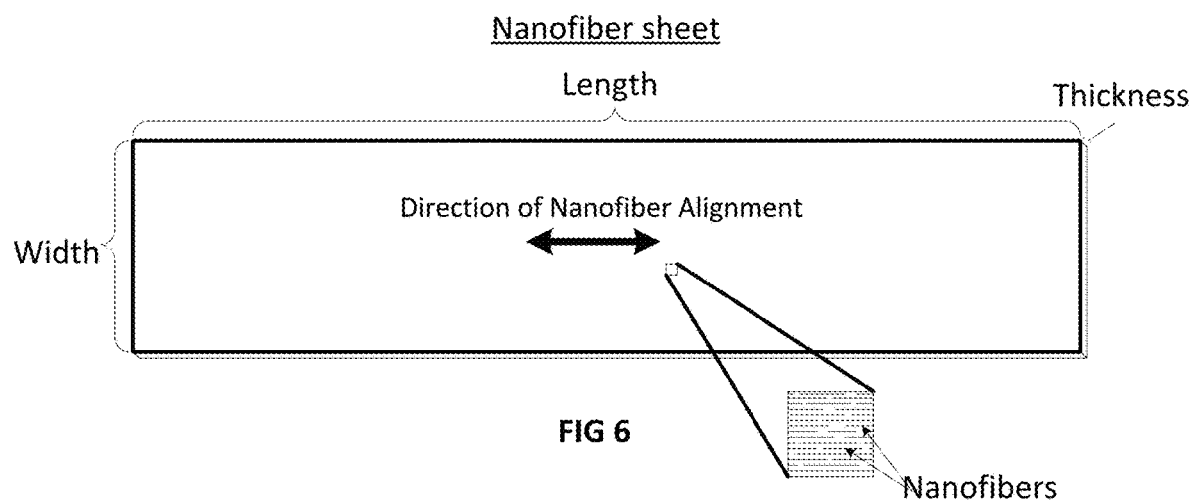
FIG. 6 provides an example nanofiber sheet layer that may be used in embodiments of the disclosed multilayer composite.

An example nanofiber sheet is shown in FIG. 6, with relative dimensions illustrated. As can be seen, the nanofibers are aligned end-to-end in a primary direction, sometimes referred to as the direction of nanofiber alignment. In some embodiments, the direction of nanofiber alignment may be continuous throughout the entire nanofiber sheet. Nanofibers are not necessarily perfectly parallel to each other and it is understood that the direction of nanofiber alignment is an average or general measure of the direction of alignment of the nanofibers.

The nanofiber sheet layer may comprise a single nanofiber sheet or a plurality of sheets, depending on the desired properties. In one embodiment, the nanofiber sheet layer comprises nanofiber sheets stacked on top of one another to form a multilayered nanofiber sheet. Nanofiber sheets may be stacked to have the same direction of nanofiber alignment or to have different directions of nanofiber alignment. Any number of nanofiber sheets may be stacked or otherwise combined to form a multilayered nanofiber sheet. For example, in some embodiments, a nanofiber sheet may include 2, 3, 4, 5, 10, or more individual nanofiber sheets, with some or all of the sheets in contact with neighboring sheets. The direction of nanofiber alignment on adjoining sheets may be the same or different from adjacent sheets. For example, sheets may have substantially similar nanofiber alignment directions, differing, for example, by less than 10°, less than 5° or less than 1°. In other embodiments, the direction of nanofiber alignment of adjoining sheets are substantially different, and may differ, for example, by more than 40°, more than 45°, more than 50°, more than 60°, more than 80°, or more than 85°. In specific embodiments, the direction of nanofiber alignment on adjoining sheets may be 90° or more, and, in one embodiment, the alignment of sheets may be substantially perpendicular. Various combinations of alignment directions are also possible and would be recognized by one of ordinary skill in the art given the benefit of this disclosure.

Figure 7:
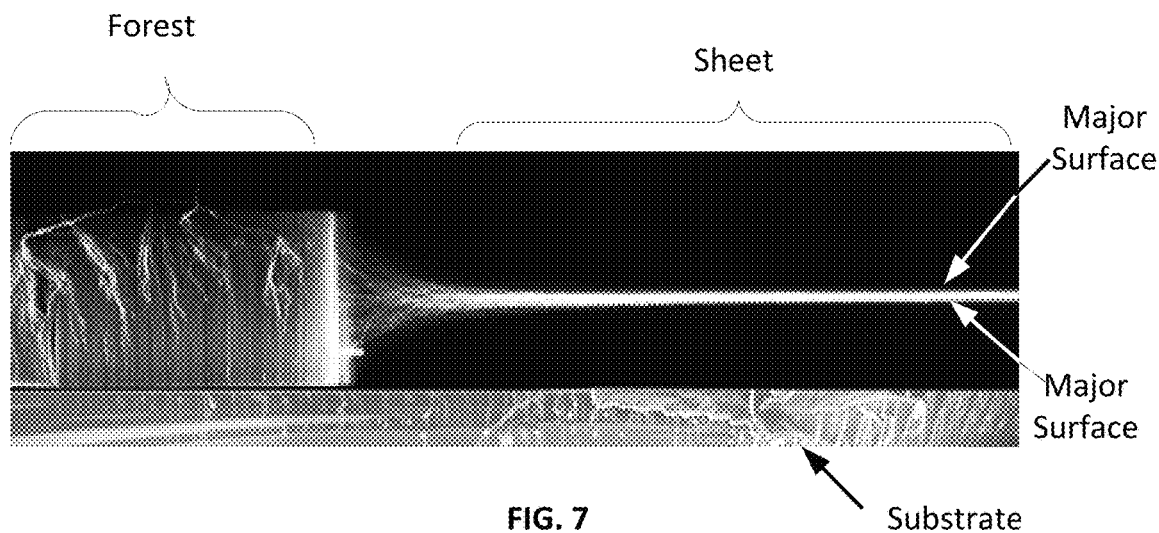
FIG. 7 shows an example embodiment of a method of drawing a nanofiber sheet for an exemplary nanofiber sheet layer.

Nanofiber sheets may be assembled using any type of suitable process known in the art capable of producing the sheet. In some example embodiments, nanofiber sheets may be drawn from a nanofiber forest, which is described in more detail below. An example of a nanofiber sheet being drawn from a nanofiber forest is shown in FIG. 7. As can be seen, the nanofibers may be drawn laterally from the forest and then aligned end-to-end to form a nanofiber sheet. In embodiments where a nanofiber sheet is drawn from a nanofiber forest, the dimensions of the forest may be controlled to form a nanofiber sheet having particular dimensions. For example, the width of the nanofiber sheet may be approximately equal to the width of the nanofiber forest from which the sheet was drawn. Additionally, the length of the sheet can be controlled, for example, by concluding the draw process when the desired sheet length has been achieved.

In some embodiments, the nanofiber sheet may optionally be densified to produce a densified nanofiber sheet having a desired density. Any appropriate densification method known in the art may be used to produce the densified nanofiber sheet. For example, in one embodiment, the densified nanofiber sheet is prepared by exposing the nanofiber sheet to at least one liquid and subsequently removing most or all of the liquid (e.g., by evaporation). A liquid may be introduced to the nanofiber sheet in a variety of ways, including, for example imbibing the liquid, exposing the sheet to an aerosol of a liquid, vapor condensation, coating, capillary absorbance, or combinations thereof. Liquids may be aqueous or non-aqueous and may be protic or aprotic solvents. Mixtures of two, three or more liquids may also be used. Densification may affect the thickness of the sheet. In some specific examples, a nanofiber sheet may have a thickness of between 10 and 20 µm prior to densification and after densification may have a thickness of between 10 to 50 nm. The volume density of a nanofiber sheet may be approximately 0.0015 g/cm$^3$ prior to densification and may increase by a factor of 360 after densification.

Using densification techniques, the volume density of various embodiments of a nanofiber sheet can be increased by a factor of greater than 10×, 20×, 50×, 100×, 500× or 1000×. Note that while the increase in volume density may in some embodiments be great, the accompanying increase in areal density may be zero or close to zero. This means that a densified sheet can have essentially the same length and width as the native sheet from which it was densified. In various embodiments, densification can result in areal shrinkage of less than 10%, less than 5% or less than 1%.

The nanofiber sheet layer comprising at least one nanofiber sheet may further comprise one or more additives, and these may be included either prior to or after nanofiber sheet formation. The additive can be any material capable of modifying or enhancing the properties of the nanofiber sheet, and can be selected, for example, to physically or chemically modify the surface properties of the nanofibers and/or nanofiber sheet. The additive can be, for example, a polymer, such as a soluble polymer or a rubber, a filler, such as a particulate filler for improving conductivity, a colorant, or various mixtures thereof. As specific examples, the additive can be a conductive material selected from the group consisting of metallic particles, metal nanoparticles, metal flakes, metal wires, metal nanowires, ceramic particles, ceramic nanoparticles, ceramic flakes, ceramic wires, ceramic nanowires, pigments, and mixtures thereof. Specific examples include, but are not limited to, magnesium diboride, titanium dioxide, and lithium phosphate. Other additives can also be used and would be recognized by one of ordinary skill in the art given the benefit of the present disclosure.

In a specific embodiment, the nanofiber sheet is post-treated with a liquid comprising at least one polymer. The polymer may be soluble in the liquid or may be insoluble, such as a latex or polymeric dispersion. After removal of the liquid, such as by evaporation, the polymer remains contained within the nanofiber sheet. The nanofiber sheet may also become densified. Various polymers can be used in this post-treatment process to prepare the polymer-containing nanofiber sheet, and the choice of polymer will depend, for example, on the targeted application and desired properties of the nanofiber sheet. Specific examples of polymers include, but are not limited to, crosslinked or non-crosslinked polymers, including polyolefins, such as polyethylene, polypropylene, fluoropolymers, including polytetrafluoroethylene (PTFE), VITON®, polyvinylidene fluoride (PVDF), fluorinated ethylene propylene (FEP), rubbers, including natural or synthetic rubbers, such as silicone rubber, and/or polyvinyl chloride (PVC). In a specific embodiment, the polymer is a heat shrinkable polymer and can be any of those used for the heat shrinkable polymer layer above described in more detail above. The amount of polymer of the nanofiber sheet layer can also be varied. The amount of polymer in the nanofiber sheet layer can be, for example, from 60% to 99.9% relative to total weight of the nanofiber sheet layer.

Furthermore, the composition of the nanofiber sheet layer can also vary depending, for example, on the intended method to apply heat to the multilayer composite. In particular, the nanofiber sheet layer may comprise a polymer as a coating on the nanofiber sheet, may comprise polymer within the nanofiber sheet itself, or a combination thereof. For example, in one embodiment, the nanofiber sheet is coated with a polymer, with or without polymer also being contained within the nanofiber sheet. For this embodiment, the external surface of the nanofiber sheet of the nanofiber sheet layer is unexposed, and the polymer can be chosen to physically and/or chemically protect the nanofiber sheet as needed in certain applications. Heat can be provided externally to cause contraction of the multilayer composite. In another embodiment, the polymer infiltrates the nanofiber sheet to produce a polymer-containing nanofiber sheet, having polymer within and/or throughout the sheet nanofibers. As such, the nanofiber sheet has an internal volume containing the polymer and an exterior surface of exposed nanofibers, which can be accessed, for example, to provide internal heating of the multilayer composite. In this way, a voltage applied to the nanofiber sheet can cause heat shrinking of the multilayer composite.

In one set of embodiments, the nanofiber sheet layer can include an adhesive layer on one or both surfaces of the nanofiber sheet. The adhesive layer may be, for example, coated, deposited or laminated to the nanofiber sheet layer. Adhesives can be pressure sensitive adhesives (PSA) or may be adhesives that can be activated by, for example, heat, radiation or solvent evaporation. The adhesive layer can cover an entire surface of the nanofiber sheet or may be patterned onto the nanofiber sheet layer in specific patterns such as polka dots or stripes. The adhesive may be conductive or non-conductive and may include conductive particles. A release layer, such as a silicone release sheet, can be applied to the adhesive layer. In other embodiments, the adhesive can be applied first to the release layer and then the adhesive/release layer can be laminated to the nanofiber sheet. In some embodiments, the adhesive can be selected from the group consisting of acrylates, epoxies, polyurethanes, silicones, rubbers, methacrylates, cyanoacrylates, phenolics and polyamides. The adhesive layer can be used to join the nanofiber sheet layer to the heat shrink polymer or it can be used to join the nanofiber layer/heat shrink composite to a surface, or both. The adhesive layer can be a distinct separate layer on the nanofiber sheet layer or it can infiltrate the nanofiber sheet layer. In some cases, nanofibers may extend into and beyond the adhesive layer and can provide electrical contact through the adhesive layer.

In another set of embodiments, a metal may be joined to the nanofiber sheet layer. For example, a conformal layer of metal can be applied to a surface of the nanofiber sheet layer. The metal can be applied before or after the nanofiber sheet layer is joined to the heat shrink polymer. A metal, such as copper or aluminum, may be applied using, for example, sputtering, electroless plating, electroplating, plasma deposition, vapor deposition, ion beam deposition, or vacuum deposition. The metal layer may cover the entire nanofiber sheet layer or only portions thereof. For instance, the metal may be deposited in a pattern such as stripes, circles or squares. The metal layer may be thin enough to flex with the nanofiber sheet layer without cracking or delaminating. In certain embodiments, the thickness of the metal layer may be, for example, less than 50 µm, less than 25 µm, less than 10 µm, less than 5 µm, less than 1 µm, less than 500 nm or less than 100 nm. The metal may also be deposited interstitially among the nanofibers, in which case it does not form a distinct layer but rather is embedded in the fibers. The metal may serve as a low resistance electrical contact and may be in electrical communication with one, two or more electrodes. The metal may provide for electrical communication between the nanofiber sheet and a voltage or current source.

Figure 8:
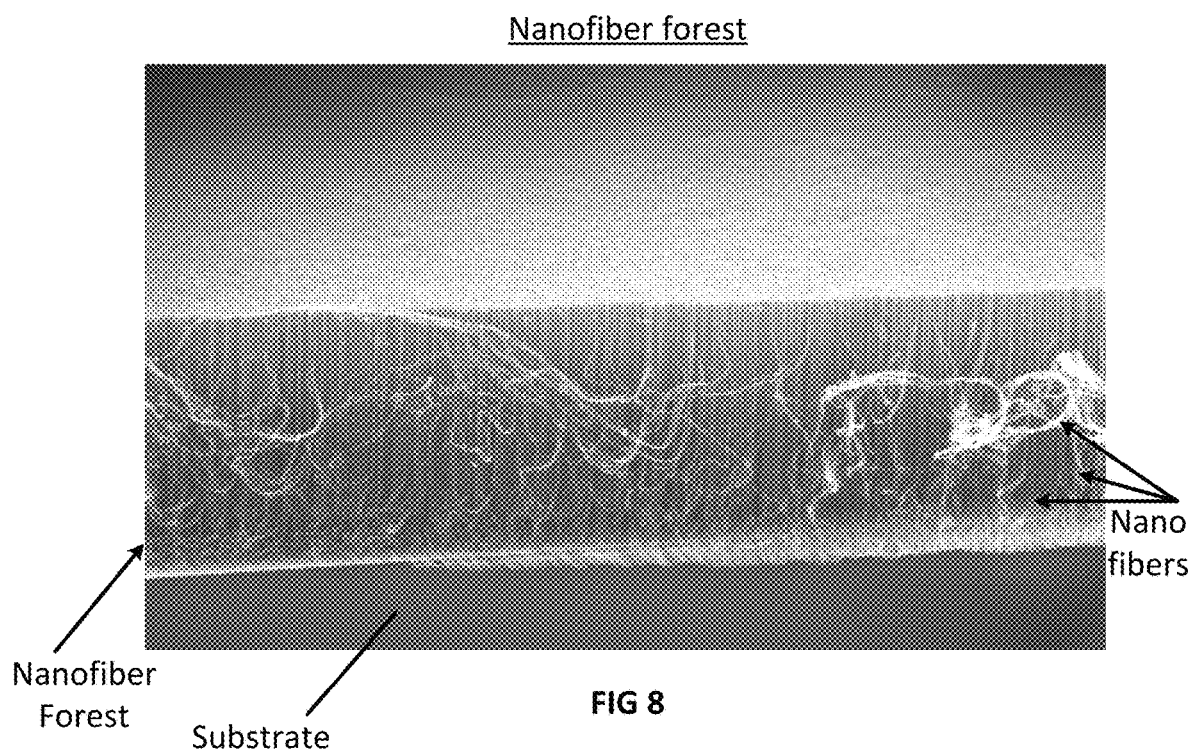
FIG. 8 shows an exemplary nanofiber forest that may be used to form a nanofiber sheet, in accordance with various embodiments of the disclosed multilayer composites.

As discussed above, the nanofiber sheet is an arrangement of nanofibers that are substantially aligned end to end in a plane. The nanofiber sheet can be prepared using any method known in the art, including, for example, using the method described in International Patent Application Publication No. WO2007/15710, incorporated by reference herein in its entirety. Thus, in accordance with various embodiments of the present disclosure, the nanofiber sheet may be prepared from nanofibers (including but not limited to carbon nanotubes) arranged in various configurations, including in a configuration referred to herein as a "forest." As used herein, a "forest" of nanofibers or carbon nanotubes refers to an array of nanofibers having approximately equivalent dimensions that are arranged substantially parallel to one another on a substrate. FIG. 8 shows an example forest of nanofibers on a substrate. The substrate may be any shape but in some embodiments the substrate has a planar surface on which the forest is assembled. As can be seen in FIG. 8, the nanofibers in the forest may be approximately equal in height and/or diameter. Thus, in a specific embodiment, a forest of nanofibers is prepared on a growth substrate, and a sheet is drawn by connecting an attachment to or near a sidewall of the nanofiber forest and drawing upon the attachment. In some embodiments, the nanofibers of the forest may each be oriented toward the substrate at approximately the same angle. For example, the nanofibers of the forest may be angled between 45° and 135° in relation to the substrate. In particular embodiments, the nanofibers of the forest may be oriented between 75° and 105° from the substrate and in select embodiments the nanofibers may be oriented approximately 90° from the substrate.

Nanofiber forests as disclosed herein may be relatively dense. Specifically, the disclosed nanofiber forests may have a density of at least 1 billion nanofibers/cm$^2$. In some specific embodiments, a nanofiber forest as described herein may have a density of between 10 billion/cm$^2$ and 30 billion/cm$^2$. In other examples, the nanofiber forest as described herein may have a density in the range of 90 billion nanofibers/cm$^2$. In some specific embodiments, a nanofiber forest as described herein may have a density of greater than $10^9$ nanofibers/cm$^2$, greater than $10^{10}$ nanofibers/cm$^2$, greater than $2\times10^{10}$ nanofibers/cm$^2$ or greater than $3\times10^{10}$ nanofibers/cm$^2$. In other embodiments, the density of the nanofiber forest in nanofibers/cm$^2$ can be between $10^9$ and $3\times10^{10}$ nanofibers/cm$^2$, between $10^{10}$ nanofibers/cm$^2$, between $3\times10^{10}$ nanofibers/cm$^2$, or between $10^{10}$ and $5\times10^{10}$ nanofibers/cm$^2$. The forest may include areas of high density or low density and specific areas may be void of nanofibers. The nanofibers within a forest may also exhibit inter-fiber connectivity. For example, neighboring nanofibers within a nanofiber forest may be attracted to one another by van der Waals forces. Regardless, a density of nanofibers within a forest can be increased by applying techniques described herein.

In some embodiments, the nanofibers of the nanofiber sheet are carbon nanotubes. As used herein, the term "carbon nanotube" encompasses both single walled carbon nanotubes (SWCNT) and/or multi-walled carbon nanotubes (MWCNT) in which carbon atoms are linked together to form a cylindrical structure. For example, the nanofibers can be multi-walled carbon nanotubes having between 4 and 10 walls. Carbon nanotubes are formed of carbon atoms linked together to form a cylindrical structure. Due to their unique structure, carbon nanotubes possess particular mechanical, electrical, chemical, thermal and optical properties that make them well-suited for certain applications. In particular, carbon nanotubes exhibit superior electrical conductivity, high mechanical strength, good thermal stability and are also hydrophobic. In addition to these properties, carbon nanotubes may also exhibit useful optical properties. For example, carbon nanotubes may be used in light-emitting diodes (LEDs) and photo-detectors to emit or detect light at narrowly selected wavelengths. Carbon nanotubes may also prove useful for photon transport and/or phonon transport.

While many intriguing properties of carbon nanotubes have been identified in the art, harnessing the properties of carbon nanotubes in practical applications requires scalable and controllable production methods that allow the features of the carbon nanotubes to be maintained or enhanced. Methods and devices have been disclosed that provide for the controlled assembly of carbon nanotubes in various configurations. For example, methods of assembling aligned carbon nanotubes on a substrate or in free-standing form are disclosed, for example, in International Patent Application Publication No. WO 2007/15710, and the carbon nanotubes and nanofibers of the present nanofiber sheet can be similarly prepared. In addition to other features, the disclosed methods allow carbon nanotubes to be successfully transferred without disrupting alignment, which allows the density of the carbon nanotube configuration to be controlled and provide opportunity for optical tuning. Furthermore, nanofiber sheets can successfully be drawn from these aligned carbon nanotubes.

As used herein, a "nanofiber sheet," "nanotube sheet," or simply "sheet" refers to a sheet of nanofibers aligned via a drawing process (as described in PCT Publication No. WO 2007/015710, and incorporated by reference herein in its entirety) so that a longitudinal axis of a nanofiber of the sheet is parallel to a major surface of the sheet, rather than perpendicular to the major surface of the sheet (i.e., in the as-deposited form of the sheet, often referred to as a "forest") and where the nanofibers are aligned end to end in a plane. This is illustrated and shown in FIGS. 6 and 7, respectively.

An illustration of an example nanofiber sheet is shown in FIG. 6 with labels of the dimensions. In some embodiments, the sheet has a length and/or width that is more than 100 times greater than the thickness of the sheet. In some embodiments, the length, width or both, are more than $10^3$, $10^6$ or $10^9$ times greater than the average thickness of the sheet. A nanofiber sheet can have a thickness of, for example, between approximately 5 nm and 30 μm and any length and width that are suitable for the intended application. In some embodiments, a nanofiber sheet may have a length of between 1 cm and 10 meters and a width between 1 cm and 1 meter. These lengths are provided merely for illustration. The length and width of a nanofiber sheet are constrained by the configuration of the manufacturing equipment and not by the physical or chemical properties of any of the nanotubes, forest, or nanofiber sheet. For example, continuous processes can produce sheets of any length. These sheets can be wound onto a roll as they are produced.

For the nanofiber sheet of the nanofiber sheet layer described herein, the dimensions of the nanofibers, such as the carbon nanotubes, in some embodiments can vary greatly depending, for example, on the production methods used. In some specific embodiments, the average diameter of the nanofibers may be between 0.4-100 nm, and the average length of the nanofiber may range from 10 μm to greater than 55.5 cm. The average thickness of the nanofibers can also vary, and, in some embodiments, the nanofiber sheet comprises nanofibers having an average thickness of less than about 100 nm and a maximum thickness of about 500 nm. The nanofibers are also capable of having very high aspect ratios (ratio of length to diameter) with some as high as 132,000,000:1. Given the wide range of dimensional possibilities, the properties of carbon nanotubes are highly adjustable or tunable.

The nanofibers can also be pre-treated, such as when aligned as a forest, prior to formation of the nanofiber sheet. In this way, properties of the nanofibers of the forest can be selected to physically or chemically modify the surface of the nanotube fibers, as in oxidation, reduction, or substitution with functional groups, such as by (1) covalently binding molecular, polymeric, or ionic species to the nanotubes; (2) forming non-covalent binding, as in van der Waals and charge-transfer binding (3) covalently or non-covalently binding species capable of hydrogen bonding, and/or (4) physically over coating with a polymer, a metal or metal alloy, a ceramic, or other material. Agents can be selected that, irrespective of bonding, at least partially encapsulate, envelop, or coat individual nanotubes or bundled nanotubes on the nanoscale.

While many intriguing properties of carbon nanotubes have been identified, harnessing the properties of carbon nanotubes in practical applications requires scalable and controllable production methods that allow the features of the carbon nanotubes to be maintained or enhanced.

Various methods can be used to produce nanofiber precursor forests, which can then be drawn into nanofiber sheets. For example, in some embodiments nanofibers may be grown in a high-temperature furnace. In some embodiments, catalyst may be deposited on a substrate, placed in a reactor and then may be exposed to a fuel compound that is supplied to the reactor. Substrates can withstand temperatures of greater than 800° C. or even 1000° C. and may be inert materials. The substrate may comprise stainless steel or aluminum disposed on an underlying silicon (Si) wafer, although other ceramic substrates may be used in place of the Si wafer (e.g., alumina, zirconia, SiO2, glass ceramics). In examples where the nanofibers of the precursor forest are carbon nanotubes, carbon-based compounds, such as acetylene may be used as fuel compounds. After being introduced to the reactor, the fuel compound(s) may then begin to accumulate on the catalyst and may assemble by growing upward from the substrate to form a forest of nanofibers. The reactor also may include a gas inlet where fuel compound(s) and carrier gasses may be supplied to the reactor and a gas outlet where expended fuel compounds and carrier gases may be released from the reactor. Examples of carrier gases include hydrogen, argon, and helium. These gases, in particular hydrogen, may also be introduced to the reactor to facilitate growth of the nanofiber forest. Additionally, dopants to be incorporated in the nanofibers may be added to the gas stream.

In a process used to fabricate a multilayered nanofiber forest, one nanofiber forest is formed on a substrate followed by the growth of a second nanofiber forest in contact with the first nanofiber forest. Multi-layered nanofiber forests can be formed by numerous suitable methods, such as by forming a first nanofiber forest on the substrate, depositing catalyst on the first nanofiber forest and then introducing additional fuel compound to the reactor to encourage growth of a second nanofiber forest from the catalyst positioned on the first nanofiber forest. Depending on the growth methodology applied, the type of catalyst, and the location of the catalyst, the second nanofiber layer may either grow on top of the first nanofiber layer or, after refreshing the catalyst, for example with hydrogen gas, grow directly on the substrate thus growing under the first nanofiber layer. Regardless, the second nanofiber forest can be aligned approximately end-to-end with the nanofibers of the first nanofiber forest although there is a readily detectable interface between the first and second forest. Multi-layered nanofiber forests may include any number of forests. For example, a multi-layered precursor forest may include two, three, four, five or more forests.

As with nanofiber forests, the nanofibers in a nanofibers sheet may be functionalized by a treatment agent by adding chemical groups or elements to a surface of the nanofibers of the sheet and that provide a different chemical activity than the nanofibers alone. Functionalization of a nanofiber sheet can be performed on previously functionalized nanofibers or can be performed on previously unfunctionalized nanofibers. Functionalization can be performed using any of the techniques described herein including, but not limited to CVD, and various doping techniques.

Further Embodiments

Thus, in some embodiments, the present disclosure relates to a method of forming a multilayer composite. The method comprises combining at least one heat shrinkable polymer layer and at least one nanofiber composite. Any of the components described above can be use in this method, and each can be prepared as discussed. For example, in one embodiment, the nanofiber sheet layer is overlaid on the heat shrinkable polymer layer so that the heat shrinkable polymer layer has a surface in contact with the nanofiber sheet layer. In another embodiment, the nanofiber sheet layer comprises at least one nanofiber sheet that is an arrangement of nanofibers aligned end to end in a plane. The nanofiber sheet can be prepared by a method comprising producing a nanofiber forest comprising nanofibers, the nanofiber forest having a sidewall; connecting an attachment to the sidewall or near the sidewall of the nanofiber forest; and drawing the nanofiber sheet from the nanofiber forest by drawing upon the attachment. In a specific embodiment, the nanofiber sheet is densified and can be prepared, for example, by a method comprising drawing a nanofiber sheet from a nanofiber forest; infiltrating the nanofiber sheet with a liquid to form an infiltrated nanofiber sheet; and evaporating the liquid from the infiltrated nanofiber sheet to form the densified nanofiber sheet. The liquid further comprises a polymer. Other variants of the method will be recognized by one of ordinary skill in the art given the benefit of the present disclosure.

Specific examples are described below. However, it should be apparent to those skilled in the art that these are merely illustrative in nature and not limiting, being presented by way of example only. Numerous modifications and other embodiments are within the scope of one of ordinary skill in the art and are contemplated as falling within the scope of the present disclosure. In addition, those skilled in the art should appreciate that the specific conditions and configurations are exemplary and that actual conditions and configurations will depend on the specific system. Those skilled in the art will also be able to recognize and identify equivalents to the specific elements shown, using no more than routine experimentation.

Example 1

In Example 1, nanofiber sheets comprising carbon nanotubes were wrapped around a heat shrink tube to determine whether the carbon nanotube sheets could be electrically heated to an extent to cause contraction of the tube. The heat shrink tube was a polyolefin plastic tube (McMaster-Carr) having a heat shrink temperature of 250° F., a shrink ratio of 2:1, a 1-inch outer diameter, and a wall thickness of 0.04 inches. The tube was wrapped sequentially with a total of 30 layers of sheets formed of pure carbon nanotubes drawn from a forest. The sheets were applied so that the alignment of the nanotubes in the sheets were at a bias angle of 45 degrees with respect to the axis of the tube. A solution of 10% poly(methyl methacrylate) (PMMA) in acetone was then sprayed on the surface of the tube coated with CNT sheets. The product was then dried at room temperature to remove all or nearly all of the acetone solvent. Electrical contacts were applied 8 inches apart on the coated tube using a flexible copper electrode held against the carbon nanotube sheets by pressure-sensitive tape (PSA tape). A voltage of 24 V was applied for 5 seconds, causing the polyolefin tube to contract by more than 50 in that time.

Example 2

In Example 2, a heat-shrink film was coated with metallized nanofiber sheets comprising carbon nanotubes. The film was a 0.00075 inch thick heat shrink polyvinyl chloride (PVC) film (McMaster Carr) having a 2:1 shrink ratio at a shrink temperature of 285° F. The film was coated with 5 layers of nanofiber sheets comprising carbon nanotubes drawn from a CNT forest. In this example, the nanofiber sheets had not been densified and were free of polymer. The nanofiber films were then coated with 10 nm of titanium (Ti) and 100 nm of silver (Ag) by electron beam deposition. The deposition was done with a planetary system that allowed semi-conformal deposition of the top layer of CNT with metals. After the metallization, the metallized CNT multi-layer composite was densified with a solution of 10% PMMA in acetone. The solution was applied to the CNT sheets by spraying. The acetone solvent was then removed by drying at room temperature. The PMMA can help adhere the underlying CNT sheet to an underlying substrate of low surface energy, such as a PVC substrate. However, subsequent sheets can adhere to each other well without any adhesive. The PVC film coated with metallized CNT sheets was then helically (45°) wrapped around a rigid PVC cylinder having a diameter of approximately 1 inch. Electrical contacts were applied to the ends of the cylinder wrapped with metallized CNT sheets, about 12 inches apart, using a flexible copper electrode held by PSA tape. A voltage of 12V supplied the only source of energy and was applied for 2 seconds to a 1 foot section of the cylinder wrapped with metallized CNT/PVC heat shrink sheets. This resulted in heating the film to 285° F., enough to cause a contraction of about 50%, The metallized CNT sheets were flexible and pliable, allowing them to be wrapped easily around the PVC tube without biasing the shape of the tube. The sheets exhibit very little memory and when wrapped around the tube showed little or no tendency to unwrap.

The foregoing description of preferred embodiments has been presented for the purposes of illustration and description. It is not intended to be exhaustive or to limit the disclosure to the precise forms shown. Modifications and variations are possible in light of the above teachings, or may be acquired from practice of the embodiments described. These embodiments were chosen in order to explain the principles and its practical application to enable one skilled in the art to utilize the various embodiments and with various modifications as are suited to the particular use contemplated. It is intended that the scope of the disclosure be defined by the claims appended hereto, and their equivalents.

The invention claimed is:

1. A multilayer composite comprising:
    at least one heat shrinkable polymer layer, wherein the at least one heat shrinkable polymer layer has a polymer orientation direction; and
    at least one carbon nanofiber sheet layer embedded in the at least one heat shrinkable polymer layer, the at least one carbon nanofiber sheet layer comprising a plurality of carbon nanofibers aligned end to end in a nanofiber orientation direction that is parallel to a length direction of the at least one carbon nanofiber sheet layer;
    wherein the multilayer composite is configured with a length and a width,
    wherein the polymer orientation direction is configured along the length of the multilayer composite,
    wherein the multilayer composite is configured to reduce in size by at least 10% in the polymer orientation direction in response to application of heat to the at least one heat shrinkable polymer layer,
    wherein the at least one carbon nanofiber sheet layer comprises a carbon nanofiber sheet drawn directly from a carbon nanofiber forest, and densified to increase a volume density of the carbon nanofiber sheet by a factor of greater than 10 times over a volume density of an undensified carbon nanofiber sheet having a value of at least 0.002 g/cm³ for providing a volume density of the densified carbon nanofiber sheet,
    wherein the volume density of the carbon nanofiber sheet is increased while a length and a width of the carbon nanofiber sheet are reduced by less than 10% from a length and a width of the undensified carbon nanofiber sheet to provide for a length and a width of the densified carbon nanofiber sheet, and
    wherein the length of the undensified carbon nanofiber sheet is greater than 1 meter, and the width of the undensified carbon nanofiber sheet is greater than 10 cm.

2. The multilayer composite of claim 1, wherein an average nanofiber diameter of the at least one carbon nanofiber sheet layer is less than about 30 nm.

3. The multilayer composite of claim 1, wherein the at least one carbon nanofiber sheet layer comprises a first carbon nanofiber sheet having a first nanofiber orientation direction different from an adjacent second carbon nanofiber sheet having a second nanofiber orientation direction, and
    wherein one of the first nanofiber orientation direction and the second nanofiber orientation direction being parallel to the length direction of the at least one carbon nanofiber sheet layer.

4. The multilayer composite of claim 1, wherein the at least one carbon nanofiber sheet layer further comprises at least one polymer infiltrated within the densified carbon nanofiber sheet.

5. The multilayer composite of claim 1, further comprising a metal layer on at least one surface of the at least one carbon nanofiber sheet layer.

6. The multilayer composite of claim 1, further comprising an additive of magnesium diboride, titanium dioxide, or lithium phosphate.

7. The multilayer composite of claim 1, wherein the at least one carbon nanofiber sheet layer comprises at least one graphene layer on the densified carbon nanofiber sheet.

8. The multilayer composite of claim 1, wherein the volume density of the densified carbon nanofiber sheet is greater than 10 to 1000 times greater than the volume density of the undensified carbon nanofiber sheet.

9. The multilayer composite of claim 1,
    wherein the length and the width of the carbon nanofiber sheet, once the carbon nanofiber sheet is densified, shrinks less than 1%.

10. The multilayer composite of claim 1, wherein end portions of the at least one carbon nanofiber sheet layer are surrounded by the at least one heat shrinkable polymer layer.

11. The multilayer composite of claim 1,
    wherein the volume density of the carbon nanofiber sheet is increased while a thickness of the carbon nanofiber sheet is reduced by at least 200 times.

12. The multilayer composite of claim 1, wherein the carbon nanofiber sheet has a thickness between 10 to 20 µm prior to densification and has a thickness between 10 to 50 nm after densification.

13. The multilayer composite of claim 1, wherein the carbon nanofiber sheet has a length or a width that is more than 100 times greater than its thickness.

14. The multilayer composite of claim 1, wherein an electrical conductivity property of the multilayer composite is maintained while volume density of the carbon nanofiber sheet is increased.

* * * * *